(12) United States Patent
Cho

(10) Patent No.: US 8,804,444 B2
(45) Date of Patent: Aug. 12, 2014

(54) SEMICONDUCTOR DEVICE INCLUDING TEST CIRCUIT AND BURN-IN TEST METHOD

(75) Inventor: Jin Hee Cho, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 310 days.

(21) Appl. No.: 13/453,467

(22) Filed: Apr. 23, 2012

(65) Prior Publication Data

US 2013/0107649 A1 May 2, 2013

(30) Foreign Application Priority Data

Oct. 28, 2011 (KR) .................. 10-2011-0111330

(51) Int. Cl.
 *G11C 7/00* (2006.01)
(52) U.S. Cl.
 USPC ............. 365/201; 365/189.05; 365/230.06; 365/236
(58) Field of Classification Search
 USPC ................ 365/201, 189.05, 236.06, 236
 See application file for complete search history.

(56) References Cited

U.S. PATENT DOCUMENTS

| 5,241,266 A | 8/1993 | Ahmad et al. |
| 6,414,890 B2 * | 7/2002 | Arimoto et al. ............ 365/201 |
| 7,539,911 B2 * | 5/2009 | Perry et al. .................. 714/718 |

FOREIGN PATENT DOCUMENTS

| KR | 100265787 B1 | 6/2000 |
| KR | 1020080013291 A | 2/2008 |
| KR | 1020080016475 A | 2/2008 |

* cited by examiner

*Primary Examiner* — Son Dinh
(74) *Attorney, Agent, or Firm* — William Park & Associates Patent Ltd.

(57) ABSTRACT

A semiconductor device includes a test circuit configured to generate a buffer control signal in response to input data, decode test commands in response to the buffer control signal, and generate test mode signals and a counting enable signal for counting row addresses and column addresses; and a data input/output circuit configured to buffer external commands in response to the buffer control signal and generate the test commands, perform a burn-in test in response to the test mode signals, and perform a read operation for memory cells corresponding to the row addresses and the column addresses.

16 Claims, 4 Drawing Sheets

| IA<4> | IA<3> | IA<2> | IA<1> | TM<1:4> | OPERATION |
|---|---|---|---|---|---|
| L | L | L | L | TM<1>='H' | RESET |
| H | L | L | L | TM<2>='H' | ODD WL ENABLE |
| H | L | H | L | TM<3>='H' | EVEN WL ENABLE |
| H | H | L | L | TM<4>='H' | ALL WL ENABLE |

FIG.4

| TCSB | TRASB | TCASB | TWEB | TM<1:4> | CNTEN | OPERATION |
|---|---|---|---|---|---|---|
| L | L | L | L | TM<1>='H' | L | RESET |
| H | L | L | L | TM<2>='H' | L | ODD WL ENABLE |
| H | L | H | L | TM<3>='H' | L | EVEN WL ENABLE |
| H | H | L | L | TM<4>='H' | L | ALL WL ENABLE |
| L | L | H | H | TM<1:4>='L' | H | ROW&COLUMN ADDRESS COUNTING |

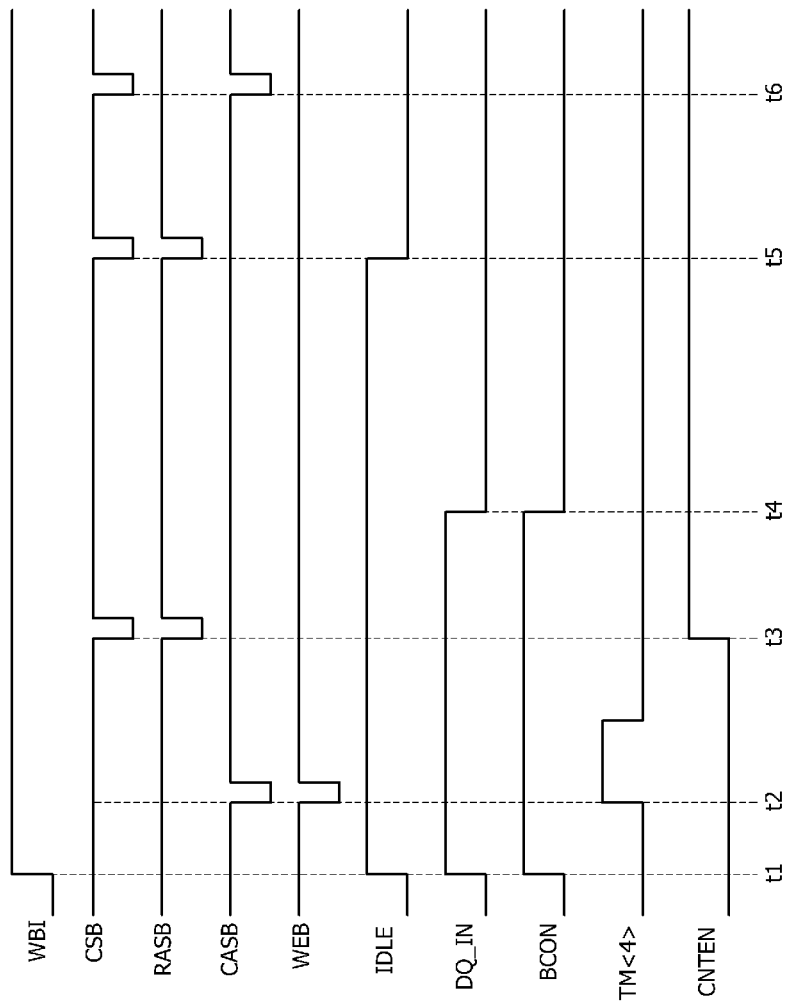

US 8,804,444 B2

SEMICONDUCTOR DEVICE INCLUDING TEST CIRCUIT AND BURN-IN TEST METHOD

CROSS-REFERENCES TO RELATED APPLICATIONS

The present application claims priority under 35 U.S.C 119(a) to Korean Application No. 10-2011-0111330, filed on Oct. 28, 2011, in the Korean Intellectual Property Office, which is incorporated herein by reference in its entirety.

BACKGROUND

In general, in a semiconductor device, to improve reliability a burn-in test is performed to remove memory cells with an initial fail probability. The burn-in test involves a test in which a factor exerting a substantial influence on determining failure of a semiconductor device, for example, a voltage is applied to memory cells by raising the voltage to a higher than normal state to induce a stress in the semiconductor device, so as to determine whether or not a fail has occurred in the semiconductor device.

FIG. 1 is a block diagram showing the configuration of a conventional semiconductor device for performing a burn-in test.

Referring to FIG. 1, the conventional semiconductor device includes a data input/output circuit 11 and a test circuit 12. The data input/output circuit 11 is configured to apply an internal command ICMD and first to fourth internal addresses IA<1:4> to the test circuit 12 and receive first to fourth test mode signals TM<1:4>. The data input/output circuit 11 is reset or performs a burn-in test in response to the first to fourth test mode signals TM<1:4>. The test circuit 12 is configured to decode the first to fourth internal addresses IA<1:4> in a state in which the preset internal command ICMD is inputted and generate the first to fourth test mode signals TM<1:4>.

Burn-in test operations performed in the semiconductor device configured in this way will be described with reference to FIG. 2.

First, the test circuit 12 decodes the first to fourth internal addresses IA<1:4> in the state in which the preset internal command ICMD is inputted and generates the first to fourth test mode signals TM<1:4> which are selectively enabled. In detail, the test circuit 12 enables the first test mode signal TM<1> to a logic high level when all the first to fourth internal addresses IA<1:4> have logic low levels, and the test circuit 12 enables the second test mode signal TM<2> to a logic high level when only the fourth internal address IA<4> has a logic high level. Also, the test circuit 12 enables the third test mode signal TM<3> to a logic high level when the second internal address IA<2> and the fourth internal address IA<4> have logic high levels, and the test circuit 12 enables the fourth test mode signal TM<4> to a logic high level when the third and fourth internal addresses IA<3:4> have logic high levels.

Next, the data input/output circuit 11 is reset or performs a burn-in test in response to the first to fourth test mode signals TM<1:4>. That is to say, the data input/output circuit 11 is reset when the first test mode signal TM<1> is enabled, and performs the burn-in test when one of the second to fourth test mode signals TM<2:4> is enabled. In detail, a stress voltage is applied to the memory cells which are connected to odd-numbered word lines of the data input/output circuit 11 when the second test mode signal TM<2> is enabled, a stress voltage is applied to the memory cells which are connected to even-numbered word lines when the third test mode signal TM<3> is enabled, and a stress voltage is applied to the memory cells which are connected to all word lines when the fourth test mode signal TM<4> is enabled.

In the semiconductor device configured as described above, the burn-in test is performed in such a manner that, after controlling word lines to be enabled, by selectively enabling the first to fourth test mode signals TM<1:4> according to level combinations of the first to fourth internal addresses IA<1:4>, a stress voltage is applied to memory cells connected to enabled word lines.

While such a burn-in test is mainly performed in a wafer state, since it is not accompanied by a read operation, whether a fail has occurred in the memory cells applied with the stress voltage is not checked during the burn-in test operations. Therefore, in the conventional semiconductor device, a burn-in test is accompanied by a read operation that is additionally performed in a package state to determine if a fail has occurred in the memory cells.

SUMMARY

Embodiments of the present invention relate to a semiconductor device including a test circuit capable of performing a burn-in test accompanied by a read operation, and a burn-in test method.

In one embodiment, a semiconductor device includes: a test circuit configured to generate a buffer control signal in response to input data inputted through a data pad, decode test commands inputted in response to the buffer control signal, and generate test mode signals and a counting enable signal for counting row addresses and column addresses; and a data input/output circuit configured to buffer external commands in response to the buffer control signal and generate the test commands, perform a burn-in test in response to the test mode signals, and perform a read operation for memory cells corresponding to the row addresses and the column addresses.

In another embodiment, a test circuit includes: a buffer control signal generation unit configured to generate a buffer control signal in response to input data inputted through a data pad when a burn-in test is performed in an idle state; a test command decoder configured to decode inputted test commands in response to the buffer control signal and generate test mode signals and a counting enable signal; and an address counter configured to count row addresses and column addresses in response to the counting enable signal.

In another embodiment, a burn-in test method includes: buffering external commands and outputting test commands, when a semiconductor device is in an idle state and input data inputted through a data pad has a first level; decoding the test commands and generating test mode signals and a counting enable signal; and counting row addresses and column addresses when the counting enable signal is enabled.

BRIEF DESCRIPTION OF THE DRAWINGS

The above and other aspects, features and other advantages will be more clearly understood from the following detailed description taken in conjunction with the accompanying drawings, in which:

FIG. 4 is a table explaining in detail operations of a control unit and a test command decoder shown in FIG. 3; and FIG. 5 is a view explaining burn-in test operations of the semiconductor device shown in FIG. 3.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figures 1, 2:
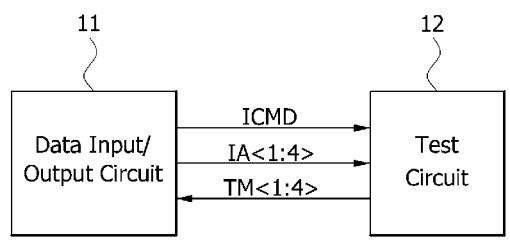
FIG. 1 is a block diagram showing the configuration of a conventional semiconductor device for performing a burn-in test.
FIG. 2 is a table explaining burn-in test operations of the semiconductor device shown in FIG. 1.
Figure 3:
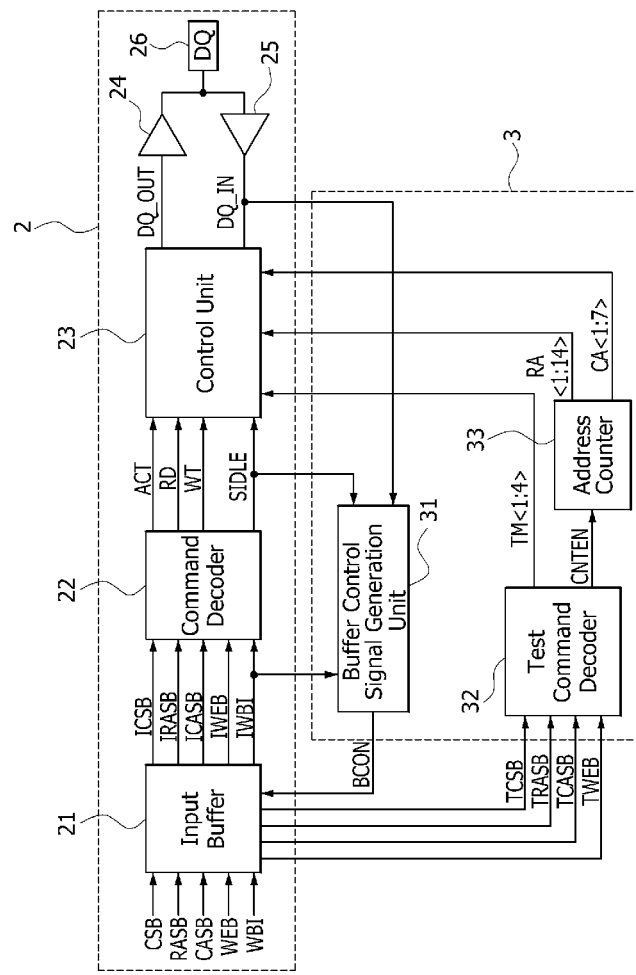
FIG. 3 is a block diagram showing a configuration of a semiconductor device for performing a burn-in test in accordance with an embodiment of the present invention.

FIG. 3 is a block diagram showing a configuration of a semiconductor device for performing a burn-in test in accordance with an embodiment of the present invention.

Referring to FIG. 3, the semiconductor device in accordance with an embodiment of the present invention includes a data input/output circuit 2 and a test circuit 3. The data input/output circuit 2 includes an input buffer 21, a command decoder 22, a control unit 23, an output driver 24, an input driver 25, and a data pad 26. The test circuit 3 includes a buffer control signal generation unit 31, a test command decoder 32, and an address counter 33.

The input buffer 21 is configured to buffer first to fourth external commands CSB, RASB, CASB and WEB in response to a buffer control signal BCON and selectively output first to fourth test commands TCSB, TRASB, TCASB and TWEB or first to fourth internal commands ICSB, IRASB, ICASB and IWEB. In detail, the input buffer 21 buffers the first to fourth external commands CSB, RASB, CASB and WEB and outputs the first to fourth test commands TCSB, TRASB, TCASB and TWEB when the buffer control signal BCON has a logic high level. The input buffer 21 buffers the first to fourth external commands CSB, RASB, CASB and WEB and outputs the first to fourth internal commands ICSB, IRASB, ICASB and IWEB when the buffer control signal BCON has a logic low level. Also, the input buffer 21 buffers a burn-in test signal WBI and outputs an internal burn-in test signal IWBI when the buffer control signal BCON has a logic low level. Here, the first external command CSB is a signal which is enabled to a logic low level when it is selected for operations of a chip including the data input/output circuit 2, and the second external command RASB is a strobing signal which is enabled to a logic low level for an active operation. Further, the third external command CASB is a column address strobing signal which is enabled to a logic low level for a read operation and a write operation, and the fourth external command WEB is a write enable signal which is enabled to a logic low level in the write operation.

The command decoder 22 is configured to decode the internal burn-in test signal IWBI and the first to fourth internal commands ICSB, IRASB, ICASB and IWEB and generate an active signal ACT for the active operation, a read signal RD for the read operation, a write signal WT for the write operation and an idle signal SIDLE. The idle signal SIDLE is a signal which is enabled to a logic high level in an idle state, that is, in a state in which an operation such as the active operation, the read operation and the write operation is not being performed in the data input/output circuit 2.

The control unit 23 is configured to reset the data input/output circuit 2 and selectively apply a stress voltage to memory cells (not shown) included in the data input/output circuit 2, in response to first to fourth test mode signals TM<1:4>. In detail, the control unit 23 resets the data input/output circuit 2 when the first test mode signal TM<1> is enabled to a logic high level, and applies the stress voltage to memory cells which are connected to odd-numbered word lines included in the data input/output circuit 2 when the second test mode signal TM<2> is enabled to a logic high level. Further, the control unit 23 applies the stress voltage to memory cells which are connected to even-numbered word lines included in the data input/output circuit 2 when the third test mode signal TM<3> is enabled to a logic high level, and the control unit 23 applies the stress voltage to memory cells which are connected to all word lines included in the data input/output circuit 2 when the fourth test mode signal TM<4> is enabled to a logic high level.

The control unit 23 drives output data DQ_OUT through the output driver 24 and outputs the output data DQ_OUT to the data pad 26 when the read signal RD is inputted at a logic high level. Moreover, the control unit 23 receives input data DQ_IN which is generated by driving the data inputted through the data pad 26, by the input driver 25, when the write signal WT is inputted at a logic high level.

The buffer control signal generation unit 31 is configured to receive the internal burn-in test signal IWBI, the idle signal SIDLE and the input data DQ_IN and generate the buffer control signal BCON. The buffer control signal BCON is generated at the logic high level when the internal burn-in test signal IWBI, the idle signal SIDLE and the input data DQ_IN all have logic high levels. In other words, the buffer control signal generation unit 31 generates the buffer control signal BCON with the logic high level when a burn-in test is performed in the idle state and the input data DQ_IN inputted through the data pad 26 has the logic high level.

The test command decoder 32 is configured to decode the first to fourth test commands TCSB, TRASB, TCASB and TWEB and generate the first to fourth test mode signals TM<1:4> and a counting enable signal CNTEN. The first to fourth test mode signals TM<1:4> and the counting enable signal CNTEN may be set to be selectively enabled according to level combinations of the first to fourth test commands TCSB, TRASB, TCASB and TWEB.

The level combinations of the first to fourth test commands TCSB, TRASB, TCASB and TWEB, which enable the first to fourth test mode signals TM<1:4> and a counting enable signal CNTEN, may be set in a variety of ways depending upon an embodiment.

The address counter 33 is configured to count row addresses RA<1:14> and column addresses CA<1:7> when the counting enable signal CNTEN of a logic high level is inputted. Further, when the counting enable signal CNTEN is enabled the control unit 23 may perform a read or write operation on the memory cells of the data input/output circuit 2 corresponding to the counted row addresses RA<1:14> and column addresses. Thus, the row addresses row addresses RA<1:14> and column addresses CA<1:7> may be associated with a memory comprised of $2^{14}$ rows and $2^7$ columns. Accordingly, counting a row address and a column address may correlate with counting a memory cell associated with a row address and column address. The address counter 33 may count the row addresses RA<1:14> and the column addresses CA<1:7>, and the address counter 33 may set or track the counting of the row addresses RA<1:14> and the column addresses CA<1:7> in a variety of ways depending upon an embodiment. For example, the counting scheme of the address counter 33 may be set in such a manner that an operation of counting the column addresses CA<1:7> by one bit (one bit at a time) after counting the $2^{14}$ row addresses RA<1:14> until all the row addresses RA<1:14> are changed from logic low levels to logic high levels. This may be repeated $2^7$ times until all the column addresses CA<1:7> are changed from logic low levels to logic high levels. In other words, all the row addresses RA<1:14> associated with a first column CA<1> may be counted first, all the row addresses RA<1:14> associated with a second column CA<2> may be counted next, and so on, until all the column addresses have been counted. Also, the counting scheme of the address counter 33 may be set in such a manner that an operation of counting the row addresses RA<1:14> by one bit after counting the $2^7$ column addresses CA<1:7> until all the column addresses CA<1:7> are changed from logic low levels to logic high levels. This may be repeated $2^{14}$ times until all the row addresses RA<1:14> are changed from logic low levels to logic high levels. In other words, all the column addresses CA<1:7> associated with a first row RA<1> may be counted first, all the column addresses CA<1:7> associated with a second row RA<2> may be counted next, and so on, until all the row addresses have been counted. Regardless of which scheme is used, the control unit 23 may perform a read or write operation on all the memory cells corresponding to counted row addresses RA<1:14> and column addresses CA<1:7>.

FIG. 4 is a table illustrating in detail operations of the control unit 23 and the test command decoder 32.

Referring to FIG. 4, the test command decoder 32 selectively enables the first to fourth test mode signals TM<1:4> and the counting enable signal CNTEN to the logic high levels according to the level combinations of the first to fourth test commands TCSB, TRASB, TCASB and TWEB. Namely, the first test mode signal TM<1> is enabled to the logic high level when all the first to fourth test commands TCSB, TRASB, TCASB and TWEB have logic low levels, the second test mode signal TM<2> is enabled to the logic high level when only the first test command TCSB has a logic high level and the remaining test commands have a logic low level, the third test mode signal TM<3> is enabled to the logic high level when only the first test command TCSB and the third test command TCASB have logic high levels and the remaining test commands have a logic low level, and the fourth test mode signal TM<4> is enabled to the logic high level when only the first test command TCSB and the second test command TRASB have logic high levels and the remaining test commands have a logic low level. Further, the counting enable signal CNTEN is enabled to a logic high level when the first test command TCSB and the second test command TRASB have logic low levels and the third test command TCASB and the fourth test command TWEB have logic high levels. When the counting enable signal CNTEN has the logic high level, the address counter 33 counts the row addresses RA<1:14> and the column addresses CA<1:7>.

Referring to FIG. 4, the control unit 23 performs various operations in response to the first to fourth test mode signals TM<1:4> and the counting enable signal CNTEN. That is to say, the reset operation for the data input/output circuit 2 is performed when the first test mode signal TM<1> is enabled, the stress voltage is applied to the memory cells which are connected to the odd-numbered word lines of the data input/output circuit 2 when the second test mode signal TM<2> is enabled, the stress voltage is applied to the memory cells which are connected to the even-numbered word lines when the third test mode signal TM<3> is enabled, and the stress voltage is applied to the memory cells which are connected to all the word lines when the fourth test mode signal TM<4> is enabled. When the counting enable signal CNTEN is enabled, the control unit 23 performs the read operation or the write operation for the memory cells corresponding to counted row addresses RA<1:14> and column addresses CA<1:7>.

Hereafter, operations of the semiconductor device configured as mentioned above will be described in detail with reference to FIG. 5.

First, at a time t1 set as an idle state, the burn-in test signal WBI is enabled to the logic high level for a burn-in test, and as the input data DQ_IN is applied at the logic high level, the buffer control signal BCON is enabled to the logic high level. When the buffer control signal BCON has the logic high level, the first to fourth external commands CSB, RASB, CASB and WEB are buffered and outputted as the first to fourth test commands TCSB, TRASB, TCASB and TWEB, and the first to fourth test mode signals TM<1:4> and the counting enable signal CNTEN are selectively enabled according to the level combinations of the first to fourth test commands TCSB, TRASB, TCASB and TWEB. In this case, at a time t2, the external commands may be set such that CSB has a logic high level, RASB has a logic high level, CASB has a logic low level, WEB has logic low level, and the buffer control signal BCON has a logic high level. Thus, test commands are output such that TCSB has a logic high level, TRASB has a logic high level, TCASB has a logic low level, and TWEB has a logic low level. Accordingly, the fourth test mode signal T<4> is enabled to the logic high level, and the stress voltage is applied to the memory cells which are connected to all the word lines of the data input/output circuit 2. Also, at a time t3, the external commands CSB has a logic low, RASB has a logic low, CASB has a logic high level, WEB has a logic high level, and the buffer control signal BCON has a logic high level. Thus, test commands are output such that TCSB has a logic low level, TRASB has a logic low level, TCASB has a logic high level and TWEB has a logic high level. Because, the counting enable signal CNTEN is enabled to the logic high level at time t3, the row addresses RA<1:14> and the column addresses CA<1:7> are counted. In other words, the control unit 23 performs a read or write operation for the memory cells corresponding to the counted row addresses RA <1:14> and column addresses CA<1:7>.

Next, at a time t4, as the input data DQ_IN transitions to the logic low level, the buffer control signal BCON is disabled to the logic low level. In the state in which the buffer control signal BCON has the logic low level, the first to fourth external commands CSB, RASB, CASB and WEB are buffered and are outputted as the first to fourth internal commands ICSB, IRASB, ICASB and IWEB.

By the first to fourth internal commands ICSB, IRASB, ICASB and IWEB, the data input/output circuit 2 may perform the active operation, the read operation and the write operation. In other words, at a time t5, as the first external command CSB and the second external command RASB are inputted at the logic low levels and the third external command CASB and the fourth external command WEB are inputted at the logic high levels, the data input/output circuit 2 performs active operations. Furthermore, at a time t6, as the first external command CSB and the third external command CASB are inputted at the logic low levels and the second external command RASB and the fourth external command WEB are inputted at the logic high levels, the control unit 23 performs the read operation for memory cells corresponding to the counted row addresses RA<1:14> and column addresses CA<1:7>.

As is apparent from the above descriptions, in the semiconductor device in accordance with an embodiment of the present invention, when the burn-in test is performed, by performing the read operation for the memory cells corresponding to the row addresses RA<1:17> and the column addresses CA<1:7> which are counted after the stress voltage is applied to selected memory cells, it is possible to check whether or not a fail has occurred in the data input/output circuit 2. As a consequence, in the case where the burn-in test is performed in a wafer state using the semiconductor device in accordance with an embodiment of the present invention, it is not necessary to perform an additional burn-in test in a package state, whereby test efficiency may be improved.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor device comprising:
   a test circuit configured to generate a buffer control signal in response to input data inputted through a data pad, decode test commands inputted in response to the buffer control signal, and generate test mode signals and a counting enable signal for counting row addresses and column addresses; and
   a data input/output circuit configured to buffer external commands in response to the buffer control signal and generate the test commands, perform a burn-in test in response to the test mode signals, and perform a read operation for memory cells corresponding to the row addresses and the column addresses.

2. The semiconductor device according to claim 1, wherein the test circuit comprises:
   a buffer control signal generation unit configured to generate the buffer control signal in response to the input data when the burn-in test is performed in an idle state.

3. The semiconductor device according to claim 2, wherein the test circuit comprises:
   a test command decoder configured to decode the test commands and generate the test mode signals and the counting enable signal; and
   an address counter configured to count the row addresses and the column addresses in response to the counting enable signal.

4. The semiconductor device according to claim 3, wherein the address counter completes a counting operation for all bits of the column addresses by repeating an operation of counting the column addresses by one bit after a counting operation for all bits of the row addresses is completed, where counting comprising performing one of a read or write operation on a memory cell associate with a row address and a column address.

5. The semiconductor device according to claim 3, wherein the address counter completes a counting operation for all bits of the row addresses by repeating an operation of counting the row addresses by one bit after a counting operation for all bits of the column addresses is completed, where counting comprising performing one of a read or write operation on a memory cell associate with a row address and a column address.

6. The semiconductor device according to claim 1, wherein the data input/output circuit comprises:
   an input buffer configured to buffer a burn-in test signal and generate an internal burn-in test signal, and buffer the external commands in response to the buffer control signal and selectively output one of internal commands or the test commands.

7. The semiconductor device according to claim 6, wherein the data input/output circuit further comprises:
   a command decoder configured to receive and decode the internal commands and generate a read signal for the read operation; and
   a control unit configured to perform the read operation for the memory cells corresponding to the row addresses and the column addresses in response to the read signal.

8. The semiconductor device according to claim 7, wherein the control unit applies a stress voltage to all memory cells in response to the test mode signals.

9. The semiconductor device according to claim 7, wherein the control unit applies a stress voltage to one of odd-numbered memory cells or even-numbered memory cells in response to the test mode signals.

10. A test circuit comprising:
    a buffer control signal generation unit configured to generate a buffer control signal in response to input data inputted through a data pad when a burn-in test is performed in an idle state;
    a test command decoder configured to decode inputted test commands in response to the buffer control signal and generate test mode signals and a counting enable signal; and
    an address counter configured to count row addresses and column addresses in response to the counting enable signal.

11. The test circuit according to claim 10, wherein the address counter completes a counting operation for all bits of the column addresses by repeating an operation of counting the column addresses by one bit after a counting operation for all bits of the row addresses is completed, where counting comprising performing one of a read or write operation on a memory cell associate with a row address and a column address.

12. The test circuit according to claim 10, wherein the address counter completes a counting operation for all bits of the row addresses by repeating an operation of counting the row addresses by one bit after a counting operation for all bits of the column addresses is completed, where counting comprising performing one of a read or write operation on a memory cell associate with a row address and a column address.

13. A burn-in test method comprising:
    buffering external commands and outputting test commands, when a semiconductor device is in an idle state and input data inputted through a data pad has a first level;
    decoding the test commands and generating test mode signals and a counting enable signal; and
    counting row addresses and column addresses when the counting enable signal is enabled.

14. The burn-in test method according to claim 13, wherein the counting is performed in such a manner that a counting operation for all bits of the column addresses is completed by repeating an operation of counting the column addresses by one bit after a counting operation for all bits of the row addresses is completed, where counting comprising performing one of a read or write operation on a memory cell associate with a row address and a column address.

15. The burn-in test method according to claim 13, wherein the counting is performed in such a manner that a counting operation for all bits of the row addresses is completed by repeating an operation of counting the row addresses by one bit after a counting operation for all bits of the column addresses is completed, where counting comprising performing one of a read or write operation on a memory cell associate with a row address and a column address.

16. The burn-in test method according to claim 13, further comprising:
    buffering the external commands and generating internal commands when the input data transitions from the first level to a second level; and decoding the internal commands and performing a read operation for memory cells corresponding to the row addresses and the column addresses.

* * * * *